(12) United States Patent
Richter et al.

(10) Patent No.: US 7,462,878 B2
(45) Date of Patent: Dec. 9, 2008

(54) LIGHT-EMITTING DIODE CHIP COMPRISING A CONVERTER LAYER AND METHOD OF MAKING A LIGHT-EMITTING DIODE CHIP COMPRISING A CONVERTER LAYER

(75) Inventors: Markus Richter, Neutraubling (DE); Franz Eberhard, Regensburg (DE); Peter Holzer, Obertraubling (DE); Ewald Karl Michael Guenther, Regenstauf (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 321 days.

(21) Appl. No.: 11/233,954

(22) Filed: Sep. 23, 2005

(65) Prior Publication Data

US 2006/0071223 A1 Apr. 6, 2006

(30) Foreign Application Priority Data

Sep. 30, 2004 (DE) .................. 10 2004 047 727

(51) Int. Cl.
*H01L 33/00* (2006.01)
(52) U.S. Cl. .......... 257/98; 257/E33.061; 257/E33.067
(58) Field of Classification Search ........... 257/98–100, 257/E33.061, E33.067; 313/501, 503, 504
See application file for complete search history.

(56) References Cited

U.S. PATENT DOCUMENTS

| | | | |
|---|---|---|---|
| 6,066,861 A | 5/2000 | Höhn et al. | 257/99 |
| 6,472,765 B1 | 10/2002 | Sano et al. | |
| 6,747,406 B1 | 6/2004 | Bortscheller et al. | |
| 6,812,500 B2 | 11/2004 | Reeh et al. | 257/98 |
| 2004/0041220 A1 | 3/2004 | Kwak et al. | |
| 2005/0244993 A1 | 11/2005 | Bogner et al. | |
| 2006/0267042 A1 | 11/2006 | Izuno et al. | |

FOREIGN PATENT DOCUMENTS

| | | |
|---|---|---|
| DE | 19908404 | 9/2000 |
| DE | 10261672 | 7/2004 |
| DE | 10308866 | 9/2004 |

(Continued)

OTHER PUBLICATIONS

I. Schnitzer et al., "30% external quantum efficiency from surface textured, thin-film light-emitting diodes", *Appl. Phys. Letter*, vol. 63, No. 16, pp. 2174-2176 (Oct. 18, 1993).

*Primary Examiner*—Minh-Loan T Tran
(74) *Attorney, Agent, or Firm*—Fish & Richardson P.C.

(57) ABSTRACT

Disclosed is a light-emitting diode chip comprising a semiconductor layer sequence suitable for emitting primary electromagnetic radiation and further comprising a converter layer that is applied to at least one main face of the semiconductor layer sequence and comprises at least one phosphor suitable for converting a portion of the primary radiation into secondary radiation, at least a portion of the secondary radiation and at least a portion of the unconverted primary radiation overlapping to form a mixed radiation with a resulting color space. The converter layer is purposefully structured to adjust a dependence of the resulting color space on viewing angle. Also disclosed is a method of making a light-emitting diode chip in which a converter layer is purposefully structured.

8 Claims, 5 Drawing Sheets

FOREIGN PATENT DOCUMENTS

| | | |
|---|---|---|
| EP | 0814642 | 12/1997 |
| EP | 1394867 | 3/2004 |
| WO | WO 98/12757 | 3/1998 |
| WO | WO 01/65613 | 9/2001 |
| WO | WO 01/69692 | 9/2001 |
| WO | WO 2004/077578 | 9/2004 |

PRIOR ART

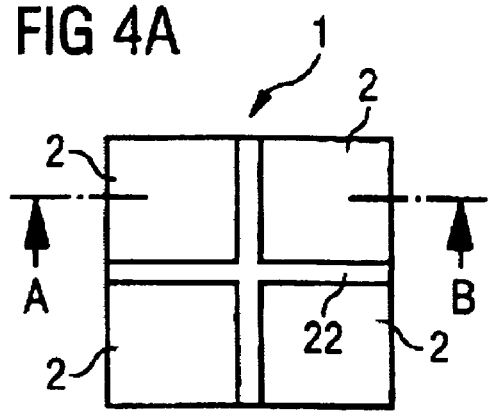
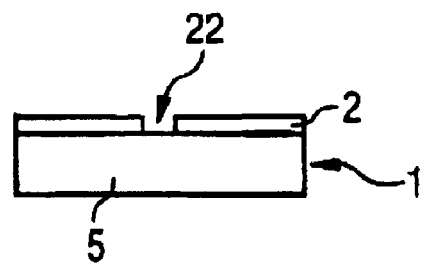
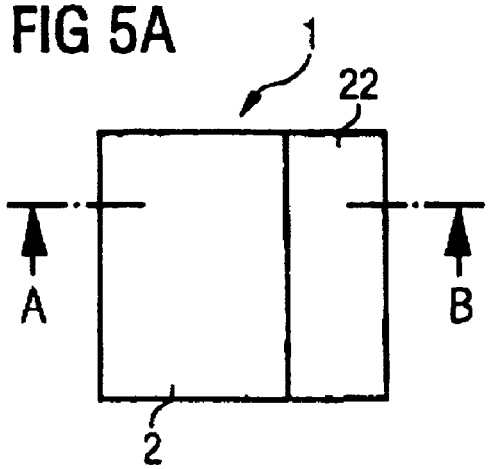
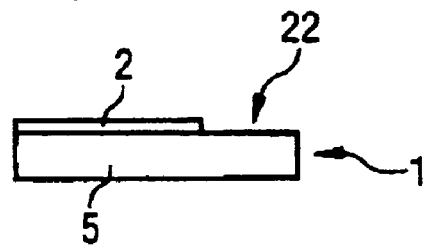
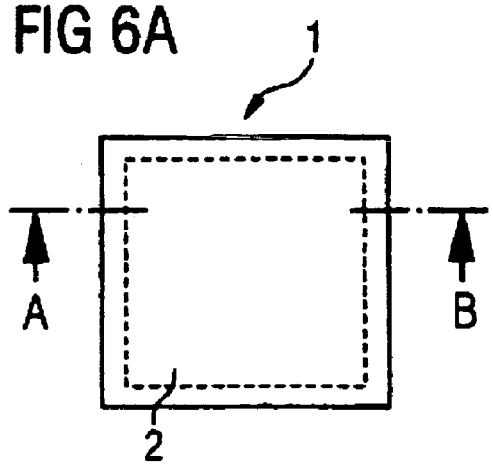
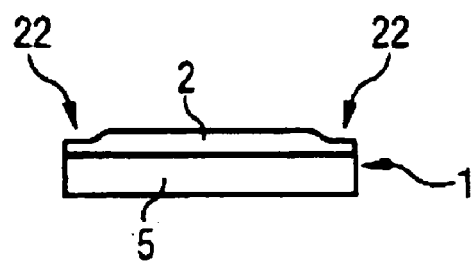

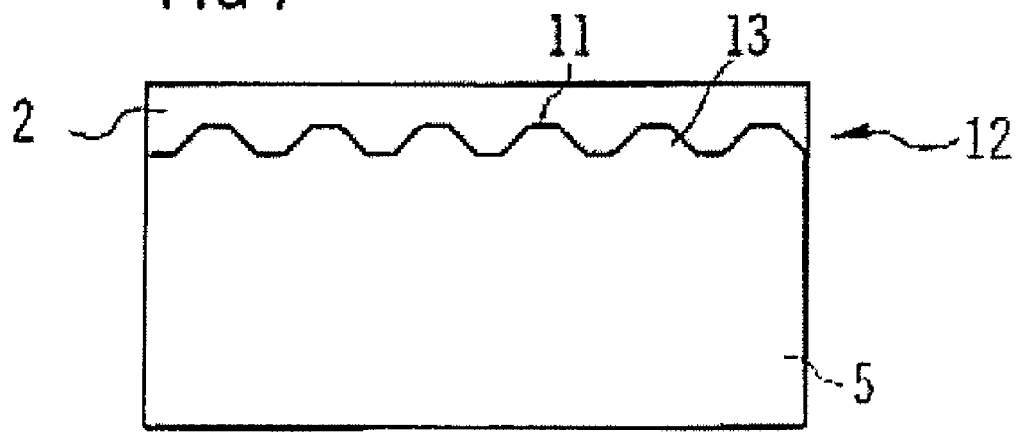
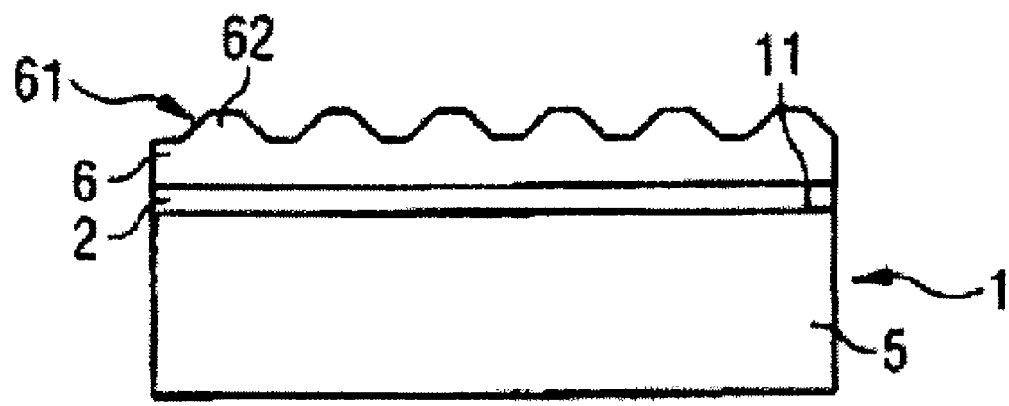

LIGHT-EMITTING DIODE CHIP COMPRISING A CONVERTER LAYER AND METHOD OF MAKING A LIGHT-EMITTING DIODE CHIP COMPRISING A CONVERTER LAYER

CROSS REFERENCE TO RELATED APPLICATION

This application claims priority to German Application No. 10 2004 047 727.2, filed Sep. 30, 2004. The contents of the prior application is incorporated herein by reference in its entirety.

TECHNICAL FIELD

The invention concerns a light-emitting diode chip comprising a semiconductor layer sequence and a converter layer and a method of making the same.

BACKGROUND

It is known to form optoelectronic components by encapsulating light-emitting diode (LED) chips by means of a potting compound into which a luminescence conversion material comprising at least one phosphor is mixed. The encapsulation is performed, for example, by molding a housing cavity in which an LED chip is mounted or by overmolding a leadframe-mounted LED chip by transfer molding.

When such potting compounds are used, color space variations can arise as a result of non-uniform distribution of the phosphor in the potting compound, due for example to the sedimentation of phosphor particles. There are also production tolerances with regard to the meterability of the potting compound, the heights of LED chips and/or the positionability of the LED chips in the cavity of an injection mold. This can lead to significant variations in the amount of potting compound disposed after the LED chip in a radiation direction, and thus to variations in the color space distribution of the component.

In WO 01/65613 A1, it is disclosed to apply a thin converter layer containing at least one phosphor directly to a semiconductor layer sequence of an LED chip. Compared to the use of phosphor-containing potting compounds, this has the advantage that phosphors can be applied in a more uniform and more definable quantity to the semiconductor layer sequence of the LED chip. Light emitted by an LED chip produced in this way usually exhibits greater uniformity in terms of its color space spectrum than components in which an LED chip is encapsulated with a phosphor-containing potting compound.

SUMMARY

In certain embodiments, it is an object of the present invention to provide an LED chip of the species cited at the beginning hereof, which, compared to conventional LED chips of this kind, has improved properties in terms of a desired color space spectrum and by means of which it is in particular possible to obtain a color space spectrum of further increased uniformity. A method of making such an LED chip is also to be specified.

According to certain embodiments of the invention, the converter layer of the LED chip is purposefully structured to adjust a dependence of the resulting color space on a viewing angle.

The converter layer is "structured" in the sense of the invention when the main face comprises subregions that are free of the converter layer and/or on which the converter layer has a reduced thickness compared to other regions on the main face. Statistical variations in the thickness of converter layers that are applied layerwise are not to be considered structuring in the sense of the invention.

The term "viewing angle" in the sense of the invention is an angle between a viewing direction of the LED chip and the normal to a principal plane of extent of the main face.

The converter layer does not lie on the main face in a form that is as homogeneous as possible, but rather is purposefully structured in such a way that different subregions of the main face are suitable for emitting light that is in different color spaces. This light from the different subregions of the main face at least partially overlaps in a far-field region perceivable by a viewer, and the dependence of the color space on viewing angle can therefore be adjusted in a number of ways.

In the case of components provided with conventional prior art LED chips, it has been found that the resulting color space shows a significant dependence on viewing angle even when the semiconductor layer sequence of the LED chip is substantially provided with a thin converter layer that is as uniform as possible and covers the entire main face of the semiconductor layer. In contrast, in a preferred embodiment of the LED chip disclosed herein, the converter layer is structured so as to reduce the dependence of the resulting color space on the viewing angle in comparison to an unstructured converter layer of a conventional LED chip.

In certain embodiments, the converter layer is advantageously structured at a margin of the LED chip. Such marginal structuring of the converter layer operates in particular to influence the color space that can be perceived at relatively large viewing angles.

In certain embodiments, the converter layer is preferably structured so that the main face comprises a band that runs along the margin of the LED chip and on which the converter layer is structured. That is, the band is free of the converter layer, or on the band the converter layer has a thickness that is reduced in comparison to its other regions on the main face. The band particularly preferably surrounds a region of the main face on which the converter layer is unstructured, e.g., it forms a frame.

In one advantageous embodiment of the LED chip, the width of the band preferably is greater than 0 μm and is no more than one-tenth an edge length of the LED chip.

In certain embodiments, the LED chip is particularly advantageously a thin-film LED chip. A thin-film LED chip is notable in particular for the following characteristic features:
  applied to or formed on a first main face of a radiation-generating epitaxial layer sequence, said face being turned toward a carrier element, is a reflecting layer that reflects at least a portion of the electromagnetic radiation generated in the epitaxial layer sequence back thereinto;
  the epitaxial layer sequence has a thickness in the range of 20 μm or less, particularly in the range of 10 μm; and
  the epitaxial layer sequence contains at least one semiconductor layer at least one face of which has an intermixed structure that in the ideal case brings about an approximately ergodic distribution of light in the epitaxial layer sequence, i.e. its stochastic scattering behavior is as ergodic as possible.

A basic principle of a thin-film LED chip is described, for example, in I. Schnitzer et al., *Appl. Phys. Lett.* 63 (16), Oct. 18, 1993, 2174-2176, whose disclosure content in this respect is hereby incorporated herein by reference.

A thin-film LED chip is, as a good approximation, a Lambertian surface radiator whose semiconductor layer sequence emits the primary radiation substantially via the main face, so that a radiation characteristic that is desirable in terms of color space can be obtained in particularly satisfactory fashion by applying a structured converter layer to the main face.

In certain embodiments, the converter layer preferably comprises silicone. This is largely insensitive to ultraviolet radiation, and is therefore particularly suitable, in connection with semiconductor layer sequences, for emitting primary radiation in an ultraviolet wavelength range.

In one advantageous embodiment, the converter layer is more than 0 μm and a maximum of 50 μm thick.

To adjust a dependence of the intensity of the primary radiation on the viewing angle, decoupling structures are preferably formed in the semiconductor layer sequence. Measures of this kind serve to further desirably affect the dependence of the resulting color space on viewing angle.

Additionally or alternatively, disposed on the converter layer is a decoupling layer in which decoupling structures are formed to adjust the dependence of the intensity of the mixed radiation on the viewing angle.

The decoupling structures formed in the semiconductor layer sequence and/or in the decoupling layer preferably include prism-like elements.

In the method of the kind cited at the beginning hereof, according to certain embodiments of the invention the semiconductor layer sequence is prepared and the main face of the semiconductor layer sequence is provided with the converter layer, said converter layer being purposefully structured to adjust the dependence of the resulting color space on viewing angle. The structuring of the converter layer can be effected by structured deposition or by applying the layer so as to cover the entire area concerned and structuring it subsequently.

In certain embodiments, the converter layer is particularly preferably structured by structured deposition using a screen printing process.

Alternatively, the converter layer is advantageously applied to the main face and structured thereafter. This is preferably done by means of a lithographic process.

DESCRIPTION OF DRAWINGS

Further advantages, preferred embodiments and improvements of the LED chip and the method will emerge from the exemplary embodiments described below in connection with FIGS. 1a to 8. Therein:

FIG. 4a is a schematic representation of a plan view of an LED chip according to a second exemplary embodiment FIG. 4b is a schematic sectional view of the LED chip depicted in FIG. 4a in a section along broken line AB FIG. 5a is a schematic representation of a plan view of an LED chip according to a third exemplary embodiment FIG. 5b is a schematic sectional view of the LED chip depicted in FIG. 5a in a section along broken linen AB FIG. 6a is a schematic representation of a plan view of an LED chip according to a fourth exemplary embodiment FIG. 6b is a schematic sectional view of the LED chip depicted in FIG. 6a in a section along broken line AB FIG. 7 is a schematic sectional view of a semiconductor layer sequence of an LED chip according to a fifth exemplary embodiment FIG. 8 is a schematic sectional view of an LED chip according to a sixth exemplary embodiment.

Figure 1A:
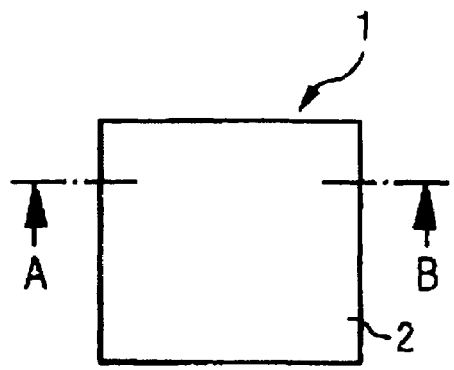
FIG. 1a is a schematic representation of a plan view of an LED chip according to the prior art

In the exemplary embodiments and figures, like or like-acting elements are provided with the same respective reference characters. The illustrated elements and the size ratios of the elements to one another should not necessarily be considered true to scale. Rather, some details of the figures have been depicted as over-large to provide a better understanding.

DETAILED DESCRIPTION

Figure 1B:
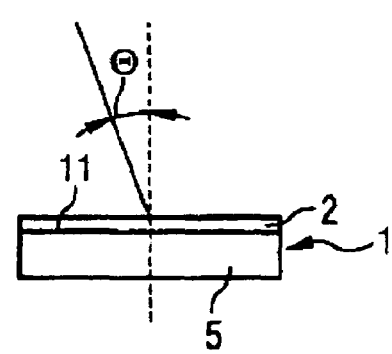
FIG. 1b is a schematic sectional view of the LED chip depicted in FIG. 1a in a section along broken line AB

Illustrated in FIGS. 1a and 1b is a conventional prior art LED chip 1 comprising a semiconductor layer sequence 5 and a converter layer 2, the latter being applied to a main face 11 of semiconductor layer sequence 5. The converter layer 2 has a substantially constant thickness of about 20 μm and extends with substantially full coverage over the entire main face 11. In other words, the converter layer 2 of the LED chip depicted in FIGS. 1a and 1b is unstructured.

The LED chip 1 is a thin-film LED Chip, whose semiconductor layer sequence 5, when subjected to a current in the direction of radiation, emits primary radiation in a blue wavelength range located around a wavelength of about 464 nm. The converter layer 2 contains the phosphor YAG:Ce. It can be excited at least by a spectral subregion of the primary radiation from semiconductor layer sequence 5 and after excitation emits secondary radiation in a yellow wavelength range.

Figure 1C:
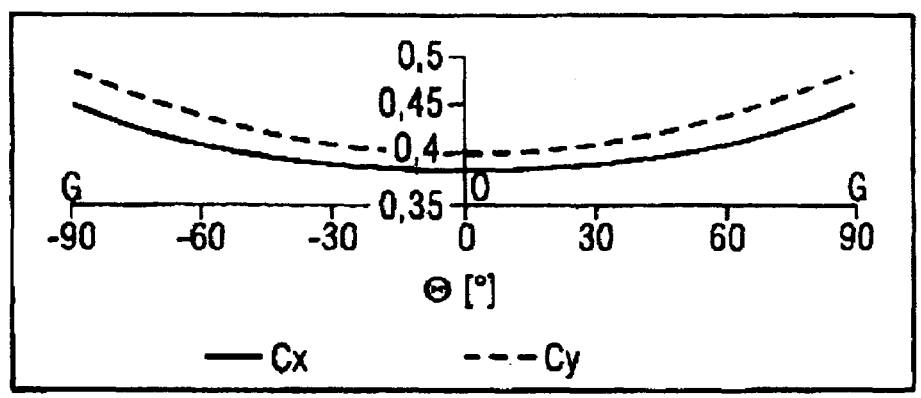
FIG. 1c shows measured color space coordinates of the CIE color chart plotted against the viewing angle of light emitted by the LED chip depicted in FIGS. 1a and 1b

In FIG. 1c, the color space and thus the color space coordinates $C_x$ and $C_y$ of the CIE color chart for mixed radiation emitted by the LED chip 1 depicted in FIGS. 1a and 1b has been measured experimentally and is/are plotted as a function of viewing angle θ.

Figure 3:
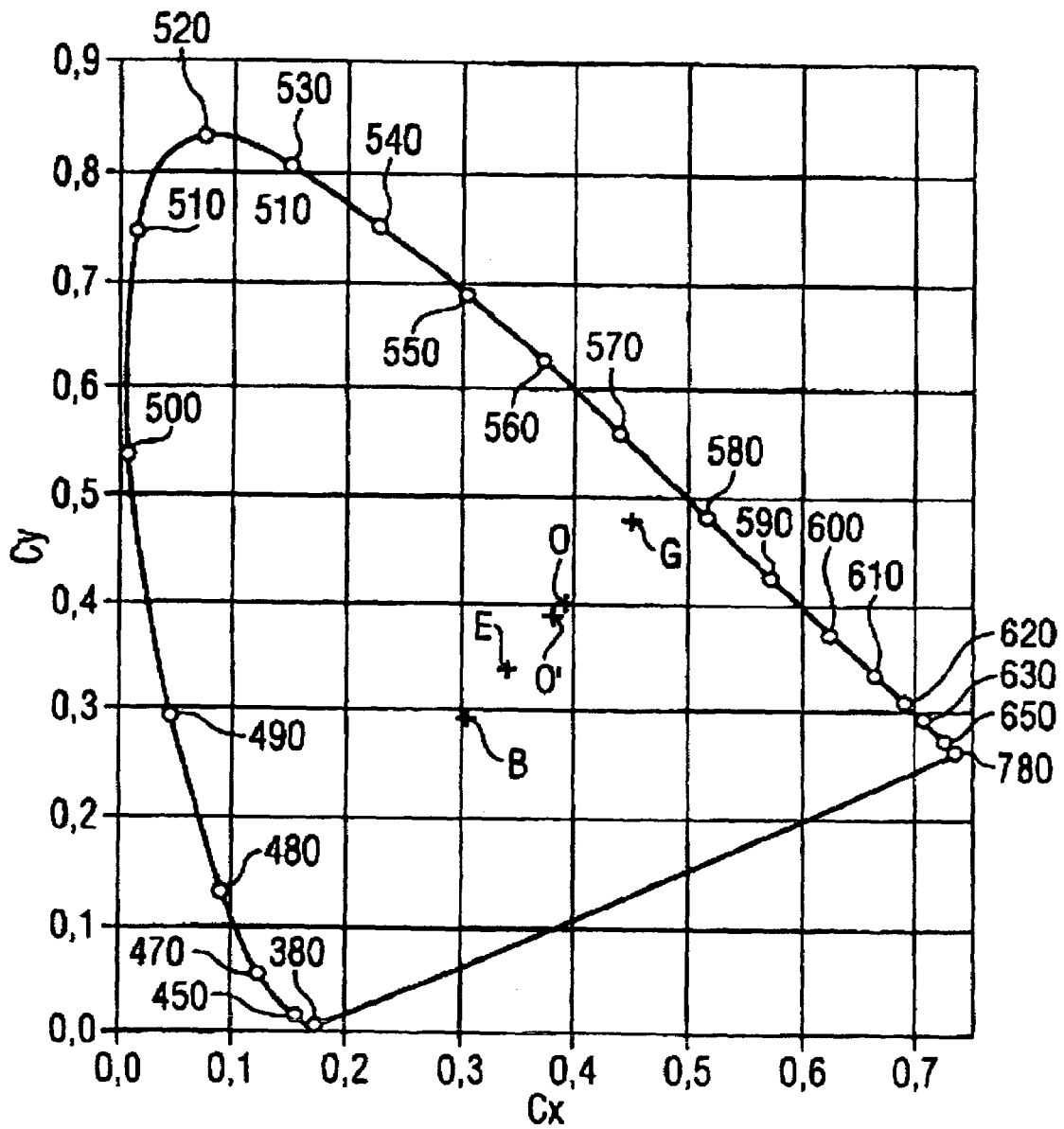
FIG. 3 shows the CIE color chart with selected points from the measurement results illustrated in FIGS. 1c and 2c entered in it

The color space O for a viewing angle θ of 0° is entered in a CIE color chart represented in FIG. 3. It is located near the achromatic point E and corresponds to a white light whose color ratios are shifted slightly into the yellow (roughly 575 nm).

As can be seen from FIG. 1c, the color space coordinates $C_x$ and $C_y$ become greater as the viewing angle θ increases, i.e., the proportion of yellow light and thus of the secondary radiation present in the mixed radiation increases with increasing viewing angle θ. The color space G for a viewing angle θ of ±90° is also entered in the CIE color chart represented in FIG. 3. Light from such a color space is perceptible essentially as yellow light, i.e., the LED chip emits light that does appear to be white at relatively small viewing angles θ of around 0°, but looks increasingly yellow at increasing viewing angles θ, particularly from ±60° on.

Figure 1D:
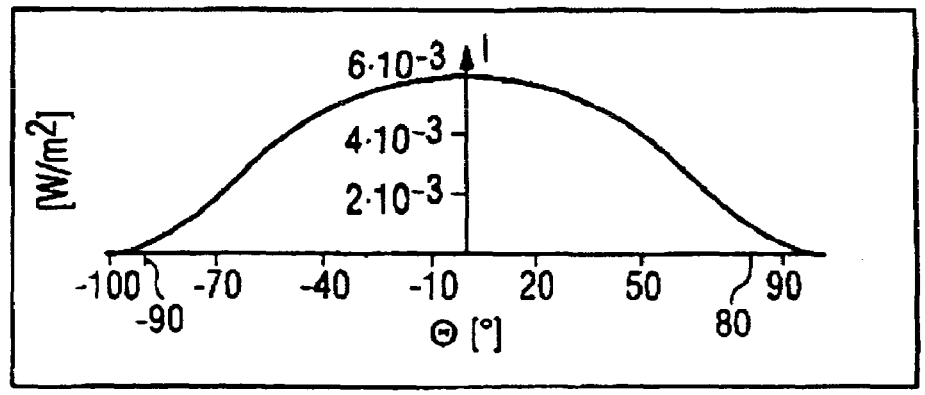
FIG. 1d shows the radiation intensity of the light emitted by the LED chip depicted in FIGS. 1a and 1b as a function of viewing angle

In FIG. 1d, a radiation intensity I emitted by LED chip 1 has been measured experimentally and is plotted against viewing angle θ. At a viewing angle θ of about ±60°, the emitted radiation intensity I has dropped to about half the maximum value that it exhibits at a viewing angle of 0°. At a viewing angle θ of approximately ±90°, the radiation intensity I is only about one-twentieth the maximum radiation intensity, i.e., the mixed radiation that looks yellowish at large viewing angles θ is emitted at a much lower radiation intensity than the mixed radiation that looks white at a viewing angle θ of around 0°. However, the yellowish-appearing component of the complex radiation is still clearly perceptible, which can be undesirable in many applications.

Figure 2A:
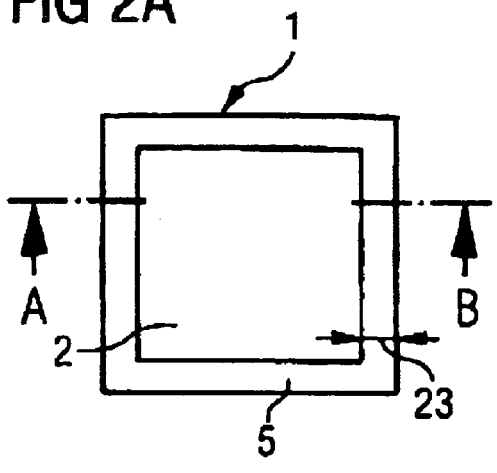
FIG. 2a is a schematic representation of a plan view of an LED chip according to a first exemplary embodiment
Figure 2B:
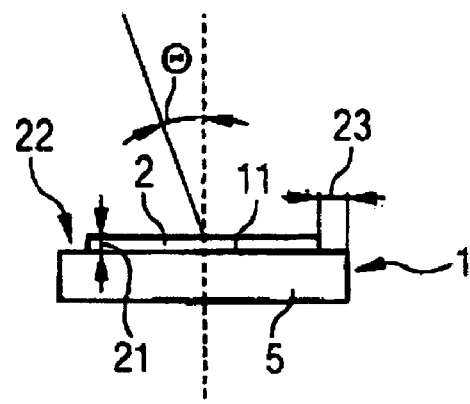
FIG. 2b is a schematic sectional view of the LED chip depicted in FIG. 2a in a section along broken line AB

Depicted in FIGS. 2a and 2b is an LED chip 1 whose only major difference from the LED chip described above in connection with FIGS. 1a and 1b is that it has a structured converter layer 2. The main face 11 of the semiconductor layer sequence 5 comprises a structuring 22 in the form of a band that is free of converter layer 2 and is disposed all around the margin of semiconductor layer sequence 5. The width 23 of this band is roughly one-tenth the chip edge length of LED chip 1, said chip edge length being approximately 300 μm. This structuring 22 has a significant effect on the angle dependence of the color space of the light emitted by the LED chip 1 and thus of the emitted mixed radiation, as is made apparent by FIGS. 2c to 3.

Figure 2C:
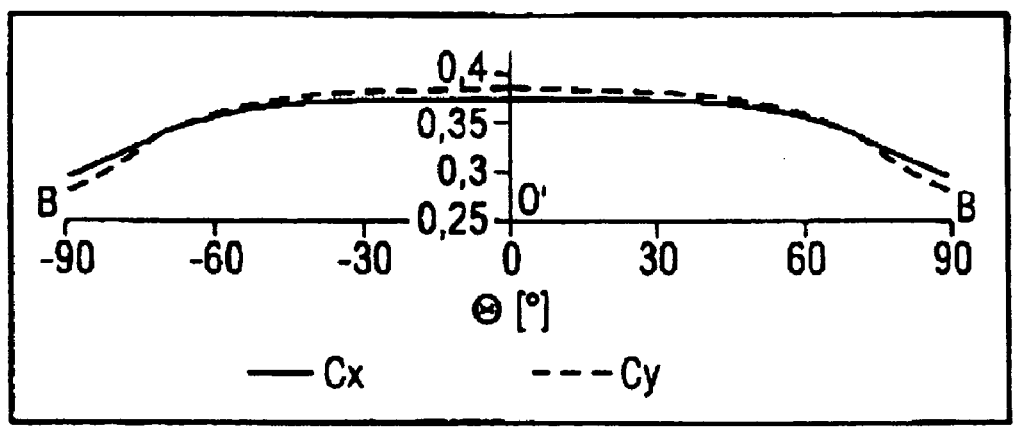
FIG. 2c shows the measured color space coordinates of the CIE color chart plotted against the viewing angle of light emitted by the LED chip depicted in FIGS. 2a and 2b
Figure 2D:
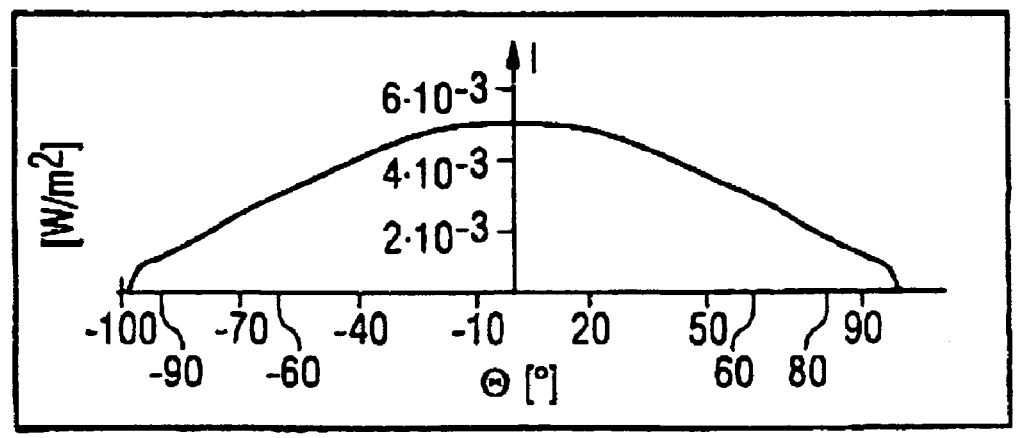
FIG. 2d shows the radiation intensity of the light emitted by the LED chip depicted in FIGS. 2a and 2b as a function of viewing angle

Light emission properties for the LED chip 1 of FIGS. 2a and 2b were also measured experimentally, with results depicted in FIGS. 2c and 2d.

In FIGS. 2c and 3, it can be seen that at a viewing angle θ of 0°, the color space O' is shifted slightly into the blue (about 470 nm) compared to the color space O of the spectrum illustrated in FIG. 1c.

At larger viewing angles θ the effect of the structuring of the converter layer 2 is much more noticeable, in that the color coordinates $C_x$ and $C_y$ become smaller, in contrast to the color space spectrum illustrated in FIG. 1c. That is, due to the structuring in the form of the band at the margin of the LED chip that is free of converter layer 2, the color space does not shift into the yellow with increasing viewing angle θ, as is the case with the unstructured converter layer 2, but instead into the blue.

Color space B of the color space spectrum illustrated in FIG. 2c for a viewing angle θ of ±90° has been entered in the CIE color chart illustrated in FIG. 3. It is shifted distinctly into the blue relative to color space O' for a viewing angle θ of 0°, but is still within a range that is perceived essentially as white.

By suitably decreasing the width 23 of the band, the color space for a viewing angle θ of ±90° can be moved closer to the color space for a viewing angle of 0°; conversely, widening the band shifts this color space still farther into the blue. A measure of the dependence of the resulting color space on the radiation angle can thus be varied within a broad range, and in particular significantly reduced in comparison to an unstructured converter layer. For this purpose, the width of the band is for example greater than or equal to 3% and less than or equal to 7% of the edge length of the LED chip. The width of the band is, for example, 18 μm.

A radiation intensity I emitted by the LED chip 1 described in connection with FIGS. 2a and 2b is plotted in FIG. 2d as a function of viewing angle θ. In contrast to the radiation intensity plotted in FIG. 1d, that of the LED chip with the unstructured converter layer depicted in FIGS. 1a and 1b, the emitted radiation intensity I at a viewing angle θ of about +60° is more than half the maximum value that it assumes at a viewing angle θ of 0°. For a viewing angle θ of about ±90°, the radiation intensity I is roughly one-fourth the maximum radiation intensity, while the corresponding radiation intensity I in the diagram represented in FIG. 1d is only one-twentieth. Structuring the converter layer therefore seems to have an effect not only on the angle dependence of the color space, but also on the angle dependence of the emitted radiation intensity.

To perform the color space and intensity measurements, both LED chips were subjected to a current of 20 mA. The thickness of the converter layer was about 20 μm in each case, and the converter layer had substantially the same composition in both cases. As mentioned hereinabove, the converter layer comprises as a phosphor a cerium-doped yttrium aluminum garnet, which when suitably excited emits secondary radiation in a yellow wavelength range. The converter layer contains for example silicone as the matrix material for the phosphor. The phosphor is present in the converter layer in a ratio of about 30 vol. %. An average grain size for the phosphor is, for example, from 2 to 4 μm inclusive (where the average grain size is based on a number distribution).

The structured converter layer is applied to the main face in structured form for example by a screen printing process. A semiconductor layer sequence is prepared for this purpose, for example in the form of a wafer for a multiplicity of LED chips. To apply the converter layer, a screen with a multiplicity of holes is used, the openings being for example about 20 μm in extent. In regions in which no converter layer or a thinner converter layer is to be applied to the main face of the semiconductor layer sequence, the screen has no holes or the holes in the screen are closed off, for example by masking. A converter compound is then brushed on through the holes in the screen, and a converter layer of substantially uniform thickness is applied to the desired regions of the main face in this way. The wafer can also be already singulated, in which case a converter layer can also be applied to side faces of the semiconductor layer sequence.

The above-described screen printing process can also be used to apply the converter layer in such a way that it has a smaller thickness in subregions. This can be achieved, for example, by means of a converter compound that has a suitably low viscosity and that, after application, flows at least partially into those regions of the main face to which it is not directly applied.

In this fashion, the converter layer can for example be applied with a structure 22, as depicted in FIGS. 6a and 6b. The structure 22 is so formed that on a band of main face 11 that runs along the margin of semiconductor layer sequence 5, converter layer 2 is applied with a smaller thickness than in the other regions thereof disposed on the main face.

As an alternative to a screen printing process, the converter layer can initially be applied over the entire area in a uniformly thick layer and structured thereafter. The structuring is done for example by means of a lithographic process, in which the converter layer is at least partially removed through a mask by etching in desired regions.

The mask can be prefabricated and is therefore applied to and aligned with the main face of the semiconductor layer sequence during the process. Alternatively, a photolithographic process, for example, can also be used, in which the mask is formed by applying and structuring a masking material. The masking material used is for example a photosensitive material, which, to produce the structuring, is exposed to light, developed and removed in regions intended for removal. A suitable etchant is used to perform the etching.

FIGS. 4a and 4b show a further exemplary embodiment of an LED chip 1. In this case, the converter layer 2 is structured such that the main face 11 is free of converter layer along two vertically intersecting bands, each of which extends in the middle of the main face 11 parallel to two respective edges of the semiconductor layer sequence 5, so that converter layer 2 comprises four mutually separated regions on main face 11. With this type of structuring 22, the resulting color space can be adjusted in particular for small viewing angles.

The LED chip illustrated in FIGS. 5a and 5b comprises on the main face only one band that is free of converter layer 2, disposed along one edge of semiconductor layer sequence 5. The width of the band is about one-third the edge length of semiconductor layer sequence 5. This type of structuring 22 makes it possible to achieve a color space spectrum for the LED chip in which the primary radiation dominates in one half-space and substantially balanced mixed light containing a large proportion of secondary radiation is emitted in the other half-space. In this way, light from a plurality of color space regions can be generated simultaneously by a single semiconductor chip. This can be of interest particularly for applications in which esthetic aspects play a role in addition to purely functional aspects which, for example, make white light necessary.

In addition to a purposefully structured converter layer, the LED chips have, for example, a semiconductor layer sequence in which decoupling structures are formed so as to adjust the dependence of the intensity of the primary radiation on viewing angle; see FIG. 7. The decoupling structures 12 include, for example, prism-like elements 13. They are formed for example by means of a photolithographic process. The decoupling structures 12 can, for example, operate to affect a preferred radiation direction of the primary radiation, which in turn has an effect on the angle dependence of the resulting color space spectrum.

Additionally or alternatively, the LED chips comprise a decoupling layer 6 disposed on converter layer 2 and provided with decoupling structures 61. These decoupling structures 61 also for example comprise prism-like elements 62. The decoupling layer 6 comprises or is composed of silicone, for example. The structures are formed for example by a photolithographic process or by means of a stamp.

The prism-like elements 62, 13 of the decoupling structures 61, 12, or the structural elements of the decoupling structures 61, 12 of the semiconductor layer sequence and/or the decoupling layer, have for example a lateral extent of from 50 nm to 5 μm inclusive, said extent preferably being no more than 1 μm.

The semiconductor layer sequence is based for example on nitride compound semiconductors, that is, it preferably contains $Al_xIn_yGa_{1-x-y}N$ where $0 \leq x \leq 1$, $0 \leq y \leq 1$ and $x+y \leq 1$. The composition of this material need not necessarily be mathematically exactly that of the above formula. It can instead comprise one or more dopants and additional constituents that do not substantially alter the physical properties of the material. For the sake of simplicity, the above formula includes only the essential components of the crystal lattice (Al, In, Ga, N), even though these components can be partially replaced by very small quantities of other substances.

When subjected to a current, the semiconductor layer sequence emits, for example, electromagnetic radiation in a blue or ultraviolet wavelength range. It can for example have a conventional pn junction, a double heterostructure, a single quantum well structure (SQW structure) or a multiple quantum well structure (MQW structure). Scuh structures are known to the skilled person and thus will not be elaborated upon here.

The converter layer can comprise either one or a plurality of different phosphors. It can also be formed as multilayer, with each layer comprising a different phosphor. Suitable for use as phosphors are, for example, inorganic phosphors such as garnet doped with rare earths, particularly with Ce or Tb, and preferably having the basic structure $A_3B_5O_{12}$, or organic phosphors such as perylene phosphors. Further suitable phosphors are listed for example in WO 98/12757 and in WO 01/65613 A1, whose content to this extent is hereby incorporated herein by reference.

The description of the invention with reference to the exemplary embodiments does not limit the invention thereto. Rather, the invention encompasses any novel feature and any combination of features, including in particular any combination of features recited in the claims, even if that feature or combination itself is not explicitly mentioned in the claims or exemplary embodiments.

What is claimed is:

1. A light-emitting diode chip comprising:
   a semiconductor layer sequence suitable for emitting primary electromagnetic radiation; and
   a converter layer that is applied to at least one main face of the semiconductor layer sequence, the converter layer comprising at least one phosphor suitable for converting a portion of the primary radiation into secondary radiation of a wavelength region that is at least partially different from that of the primary radiation,
   wherein at least a portion of the secondary radiation and at least a portion of the unconverted primary radiation overlap to form a mixed radiation with a resulting color space;
   wherein the converter layer is structured at least at a margin of the light-emitting diode chip to adjust a dependence of the resulting color space on viewing angle; and
   wherein the converter layer is structured so that the at least one main face comprises a band that extends along the edge of the light-emitting diode chip, the band comprising a reduced thickness of the converter layer or no converter layer compared to other regions on the at least one main face, and the band having a width of no more than one-tenth of an edge length of the light-emitting diode chip.

2. The light-emitting diode chip as in claim 1, wherein the converter layer is structured so as to reduce the dependence of the resulting color space on viewing angle in comparison to an unstructured converter layer.

3. The light-emitting diode chip as in claim 1, wherein the light-emitting diode chip is a thin-film light-emitting diode chip.

4. The light-emitting diode chip as in claim 1, wherein the converter layer comprises silicone.

5. The light-emitting diode chip as in claim 1, wherein the converter layer is more than 0 μm and a maximum of 50 μm thick.

6. The light-emitting diode chip as in claim 1, wherein decoupling structures are formed in the semiconductor layer sequence to adjust a dependence of the intensity of the primary radiation on viewing angle.

7. The light-emitting diode chip as in claim 6, wherein the decoupling structures include prism-like elements.

8. The light-emitting diode chip as in claim 1, wherein disposed on the converter layer is a decoupling layer in which decoupling structures are formed to adjust a dependence of the intensity of the mixed radiation on viewing angle.

* * * * *